United States Patent
Chiang et al.

(10) Patent No.: US 7,772,650 B2
(45) Date of Patent: Aug. 10, 2010

(54) LAYOUT STRUCTURE OF ELECTROSTATIC DISCHARGE PROTECTION CIRCUIT

(75) Inventors: Hsueh-Li Chiang, Hsinchu County (TW); Yan-Nan Li, Taipei County (TW)

(73) Assignee: Novatek Microelectronics Corp., Hsinchu (TW)

(*) Notice: Subject to any disclaimer, the term of this patent is extended or adjusted under 35 U.S.C. 154(b) by 201 days.

(21) Appl. No.: 11/558,446

(22) Filed: Nov. 10, 2006

(65) Prior Publication Data

US 2008/0067598 A1    Mar. 20, 2008

(30) Foreign Application Priority Data

Sep. 14, 2006  (TW) ............... 95133978 A

(51) Int. Cl.
*H01L 23/62* (2006.01)
(52) U.S. Cl. .................. 257/355; 257/358
(58) Field of Classification Search .......... 257/355, 257/358

See application file for complete search history.

(56) References Cited

U.S. PATENT DOCUMENTS

| | | | | |
|---|---|---|---|---|
| 5,270,565 A | * | 12/1993 | Lee et al. | 257/358 |
| 5,430,595 A | * | 7/1995 | Wagner et al. | 361/56 |
| 5,493,142 A | * | 2/1996 | Randazzo et al. | 257/328 |
| 5,637,900 A | * | 6/1997 | Ker et al. | 257/355 |
| 6,008,508 A | * | 12/1999 | Bergemont et al. | 257/175 |
| 6,359,313 B1 | * | 3/2002 | Yang et al. | 257/355 |
| 6,373,118 B1 | * | 4/2002 | Lewyn | 257/488 |
| 6,459,127 B1 | * | 10/2002 | Lee et al. | 257/355 |
| 6,465,848 B2 | * | 10/2002 | Ker et al. | 257/355 |
| 6,794,715 B1 | * | 9/2004 | Liu et al. | 257/346 |
| 6,815,775 B2 | * | 11/2004 | Ker et al. | 257/355 |
| 6,815,776 B2 | * | 11/2004 | Lee et al. | 257/361 |
| 7,217,966 B1 | * | 5/2007 | Vashchenko et al. | 257/210 |
| 7,402,846 B2 | * | 7/2008 | Schwantes et al. | 257/202 |
| 2002/0053704 A1 | * | 5/2002 | Avery et al. | 257/361 |

* cited by examiner

*Primary Examiner*—Bradley K Smith
*Assistant Examiner*—Alexander Belousov
(74) *Attorney, Agent, or Firm*—Jianq Chyun IP Office

(57) ABSTRACT

A layout structure of an electrostatic discharge protection circuit and a fabrication process thereof are provided. The electrostatic discharge protection circuit includes a substrate, a protection element and a resistor, wherein a part of or all of the area of the resistor is disposed in the region of the protection element, which saves the footprint of the resistor and reduces a junction parasitic capacitance formed in the protection element. Thus, the production cost of the electrostatic discharge protection circuit is reduced, and the influence of the electrostatic discharge protection circuit on the property of the entire internal circuit is minimized.

6 Claims, 12 Drawing Sheets

US 7,772,650 B2

LAYOUT STRUCTURE OF ELECTROSTATIC DISCHARGE PROTECTION CIRCUIT

CROSS-REFERENCE TO RELATED APPLICATION

This application claims the priority benefit of Taiwan application serial no. 95133978, filed Sep. 14, 2006. All disclosure of the Taiwan application is incorporated herein by reference.

BACKGROUND OF THE INVENTION

1. Field of the Invention

The present invention relates to an electrostatic discharge protection circuit and a fabrication process thereof, and more particularly, to a layout structure of an electrostatic discharge protection circuit applicable in an integrated circuit, and a fabrication process thereof.

2. Description of Related Art

The main architecture of an electrostatic discharge protection circuit includes a protection element and a resistor, wherein the resistor is a current-limiting resistor. This architecture effectively enhances the capability for electrostatic discharge (ESD) protection. As shown in FIG. 11, in the layout design of a conventional electrostatic discharge protection circuit, the resistor 30 is disposed outside the protection element 40, and thus occupies an additional area. Moreover, this layout causes the overlapped area between the drain D of the protection element 40 and the substrate to be relatively large, so that a relatively large parasitic capacitance will be formed, which influences the operating performance of the chip, and causes the problem of crosstalk.

As the transmission speed in telecommunications is increasingly enhanced and the frequency of operating interface circuits is increasingly high, a signal transmission interface circuit with higher quality and higher speed is required. To solve the above problems, a conventional solution is to add protection circuits around signal lines with excessive large capacitance, and the protection circuits are connected to a stable signal source (normally the ground or a power source), so as to form a masking effect to isolate the signal lines. Another solution is to prevent the aforementioned effect by increasing the distance between two signal lines. However, although the problems are solved, the conventional solutions both require additional space.

SUMMARY OF THE INVENTION

The present invention is directed to a layout structure of an electrostatic discharge protection circuit, so as to save a chip area and reduce parasitic capacitance.

The present invention is also directed to a process of fabricating an electrostatic discharge protection circuit that can increase the space utilization ratio and reduce parasitic capacitance.

According to an aspect of the present invention, a layout structure of an electrostatic discharge protection circuit is provided, which comprises a substrate, a protection element disposed on the substrate and a resistor disposed on the substrate. The protection element is used to receive an electrostatic discharge current to protect an internal circuit from being influenced by the electrostatic discharge current. A part of or all of the area of the resistor is disposed in the region of the protection element, and one end of the resistor is coupled to the protection element.

According to another aspect of the present invention, a process of fabricating the electrostatic discharge protection circuit is provided, which comprises the following steps: providing a substrate; forming a protection element on the substrate for receiving an electrostatic discharge current to protect an internal circuit from the electrostatic discharge current, wherein the region of the protection element includes an isolation region; forming a resistor on the substrate, wherein a part of or all of the area of the resistor is disposed in the isolation region; and forming electrical connections to couple an end of the resistor to the protection element.

In the present invention, the resistor is arranged within the protection element, so the area of the resistor is saved, and the overlapped area between an upper plate and a lower plate of the parasitic capacitor is reduced, so that the corresponding parasitic capacitance is reduced. Therefore, the present invention not only enhances the space-utilization rate, but also minimizes the influence of the electrostatic discharge protection circuit on the property of the entire internal circuit, which further enhances the performance of the internal circuit.

In order to male the aforementioned and other objects, features and advantages of the present invention comprehensible, preferred embodiments accompanied with figures are described in detail below.

DESCRIPTION OF EMBODIMENTS

Figure 1:
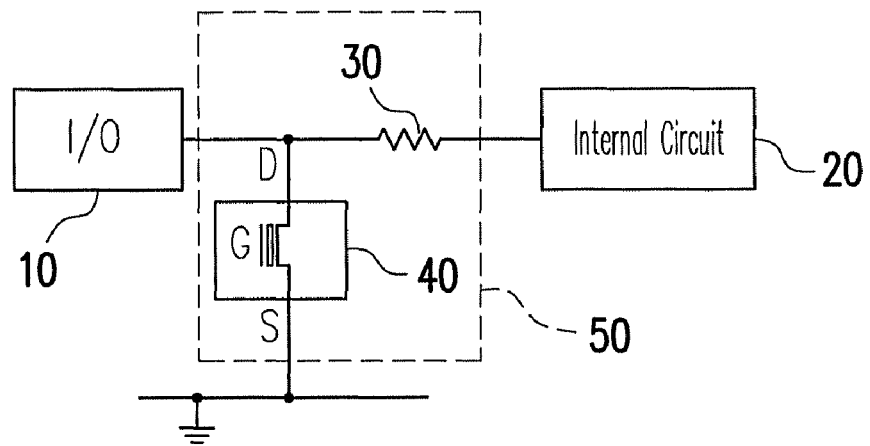
FIGS. 1 and 2 are circuit diagrams of an electrostatic discharge protection circuit with an FOD transistor as the protection element.
Figure 2:
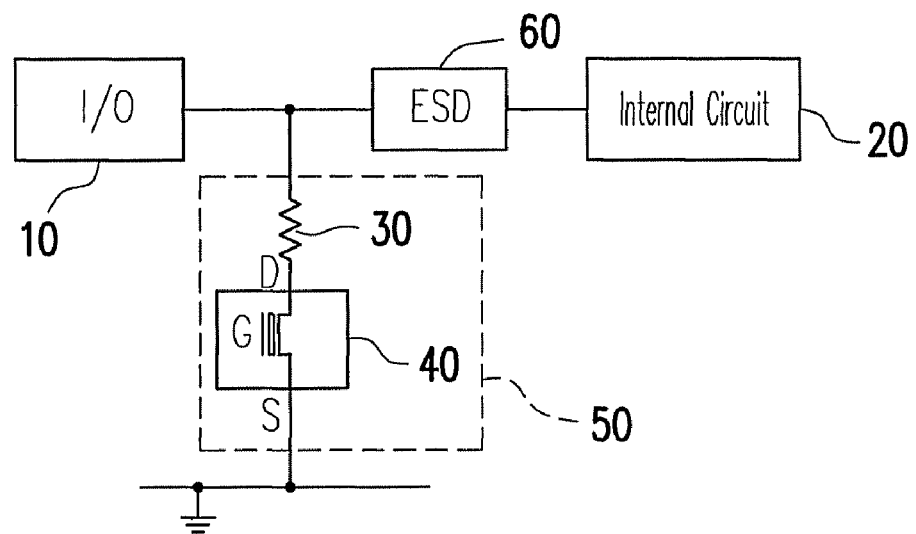

FIGS. 1 and 2 are circuit diagrams of an electrostatic discharge protection circuit. A field oxide device transistor (referred as FOD transistor below) 40 is used here as a protection element of an electrostatic discharge protection circuit 50. As shown in FIG. 1, in the electrostatic discharge protection circuit 50, a resistor 30 is coupled between an I/O pad 10 and an internal circuit 20, and it is a current-limiting resistor, for preventing an electrostatic discharge current from flowing to the internal circuit 20 via the pad 10. A drain D of the FOD transistor 40 is coupled between the pad 10 and the resistor 30, a source S of the FOD transistor 40 is grounded, and a gate G is in a floating state. Therefore, when the electrostatic discharge occurs, the electrostatic discharge protection circuit 50 provides a path of the electrostatic discharge current from the pad 10 to the ground, so as to prevent the electrostatic discharge current from damaging the internal circuit 20 and causing internal damages.

As shown in FIG. 2, another electrostatic discharge circuit 60 is coupled between the pad 10 and the internal circuit 20. The electrostatic discharge protection circuit 60 is used to prevent the electrostatic discharge current from flowing into the internal circuit 20 via the pad 10. The electrostatic discharge protection circuit 50 in FIG. 2 is implemented in a way different from that of the embodiment of FIG. 1. In this embodiment, a first end of the resistor 30 in the electrostatic discharge protection circuit 50 is coupled between the pad 10 and another electrostatic discharge protection circuit 60, and a second end of the resistor 30 is coupled to the drain D of the FOD transistor 40. The source S of the FOD transistor 40 is grounded, and the gate G is in the floating state.

Figure 3:
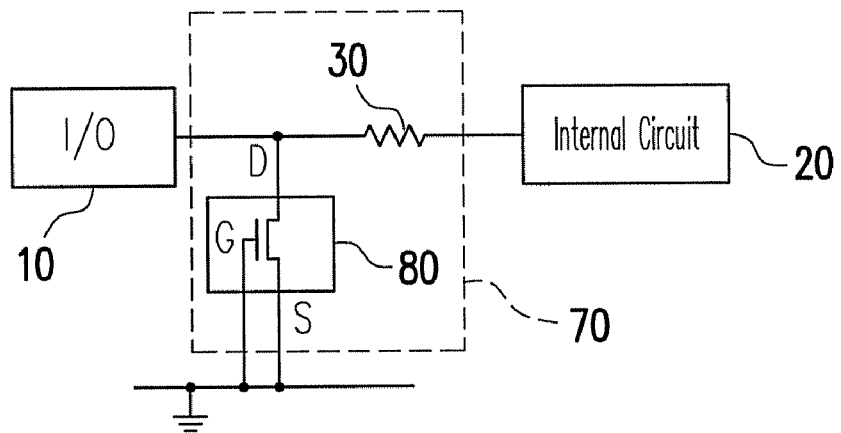
FIGS. 3 and 4 are circuit diagrams of an electrostatic discharge protection circuit with an NMOS transistor as the protection element.
Figure 4:
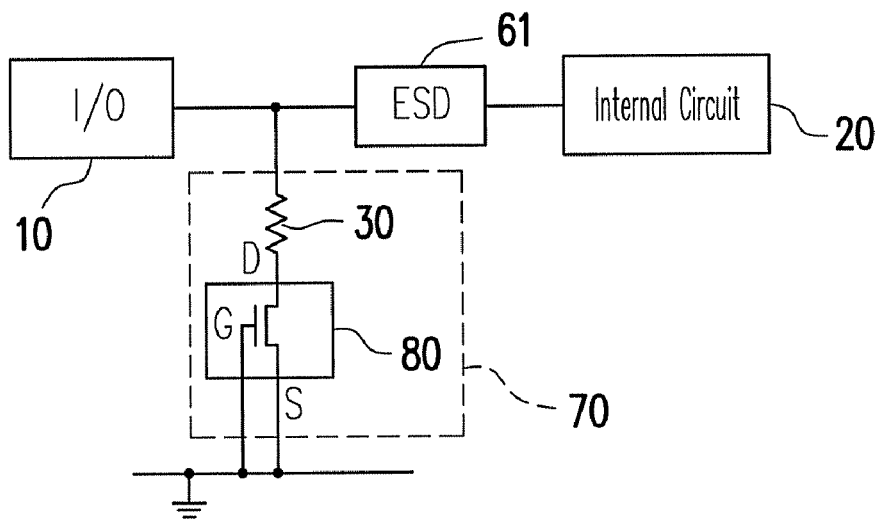

FIGS. 3 and 4 are circuit diagrams of another electrostatic discharge protection circuit. An N-type metal oxide semiconductor transistor (referred as NMOS transistor below) is used here as the protection element of an electrostatic discharge protection circuit 70. As shown in FIG. 3, the resistor 30 is coupled between the pad 10 and the internal circuit 20, and it is a current-limiting resistor used for preventing the electrostatic discharge current from flowing into the internal circuit 20 via the pad 10. A drain D of the NMOS transistor 80 is coupled between the pad 10 and the resistor 30, and a gate G and a source S of the NMOS transistor 80 are both grounded.

In FIG. 4, another electrostatic discharge protection circuit 61 is coupled between the pad 10 and the internal circuit 20, which is used for preventing the electrostatic discharge current from flowing into the internal circuit 20 via the pad 10. The electrostatic discharge protection circuit 70 in FIG. 4 is implemented in a way different from that of the embodiment of FIG. 3. In this embodiment, a first end of the resistor 30 in the electrostatic discharge protection circuit 70 is coupled between the pad 10 and another electrostatic discharge protection circuit 61, and a second end of the resistor 30 is coupled to the drain D of the NMOS transistor 80. The gate G and the source S of the NMOS transistor 80 are both grounded.

Figure 5:
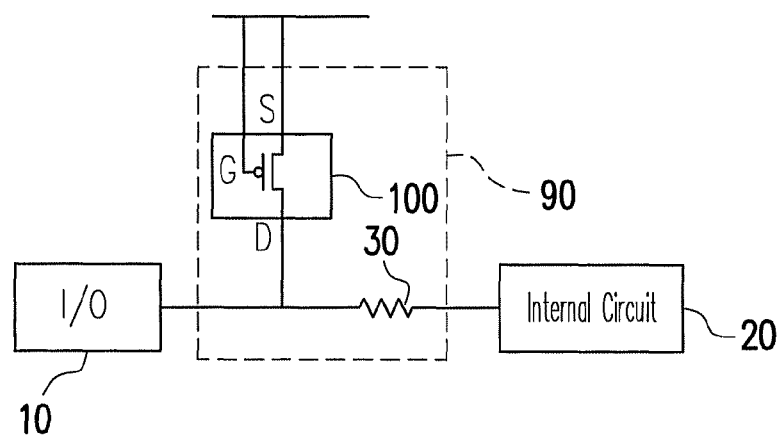
FIGS. 5 and 6 are circuit diagrams of an electrostatic discharge protection circuit with a PMOS transistor as the protection element.
Figure 6:
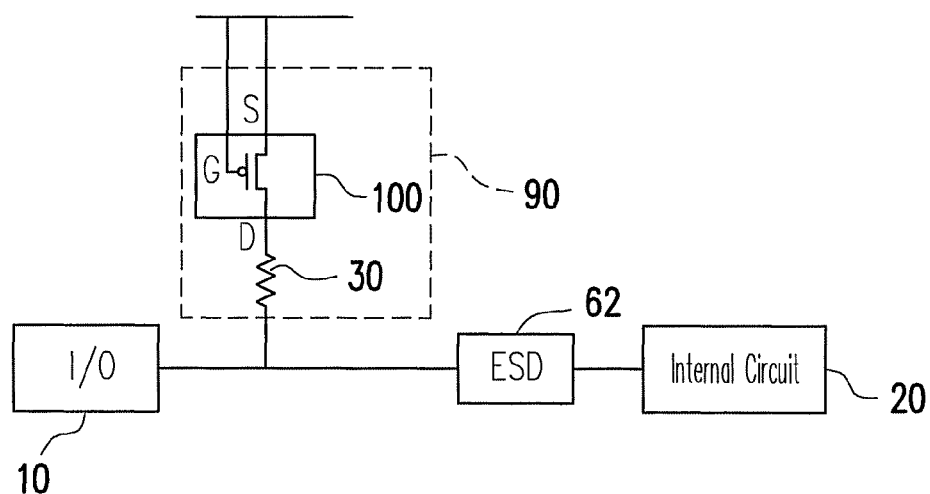

FIGS. 5 and 6 are circuit diagrams of another electrostatic discharge protection circuit. A P-type metal oxide semiconductor transistor (referred as PMOS transistor below) is used here as the protection element of an electrostatic discharge protection circuit 90. As shown in FIG. 5, the resistor 30 is coupled between the pad 10 and the internal circuit 20, and it is a current-limiting resistor used for preventing the electrostatic discharge current from flowing into the internal circuit 20 via the pad 10. A drain D of the PMOS transistor 100 is coupled between the pad 10 and the resistor 30, and a source S and a gate G of the PMOS transistor 100 are both coupled to a supply voltage.

In FIG. 6, another electrostatic discharge protection circuit 62 is coupled between the pad 10 and the internal circuit 20, which is used for preventing the electrostatic discharge current from flowing into the internal circuit 20 via the pad 10. The electrostatic discharge protection circuit 90 in FIG. 6 is implemented in a way different from that of the embodiment of FIG. 5. In this embodiment, a first end of the resistor 30 in the electrostatic discharge protection circuit 90 is coupled between the pad 10 and another electrostatic discharge protection circuit 62, and a second end of the resistor 30 is coupled to the drain D of the PMOS transistor 100. The gate G and the source S of the PMOS transistor 100 are both coupled to the supply voltage.

Figure 7:
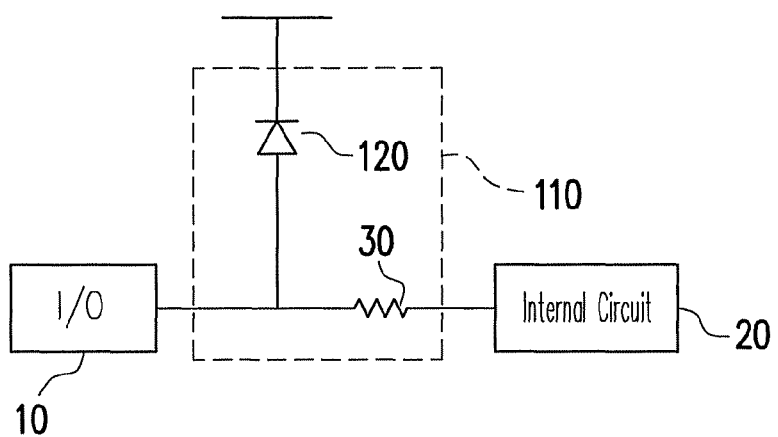
FIGS. 7-10 are circuit diagrams of an electrostatic discharge protection circuit with a diode as the protection element.

FIGS. 7-10 are circuit diagrams of another electrostatic discharge protection circuit. A diode 120 is used here as the protection element of an electrostatic discharge protection circuit 110. The principle of the circuit diagrams is to use the reverse characteristic of the diode, that is, the diode is broken down and has a reversed conductance capability when the reverse voltage on both ends of the diode is higher than a certain value. As shown in FIG. 7, the resistor 30 is coupled between the pad 10 and the internal circuit 20, and it is a current-limiting resistor used for preventing the electrostatic discharge current from flowing into the internal circuit 20 via the pad 10. An anode of the diode 120 is coupled between the pad 10 and the resistor 30, and a cathode of the diode 120 is coupled to the supply voltage.

Figure 8:
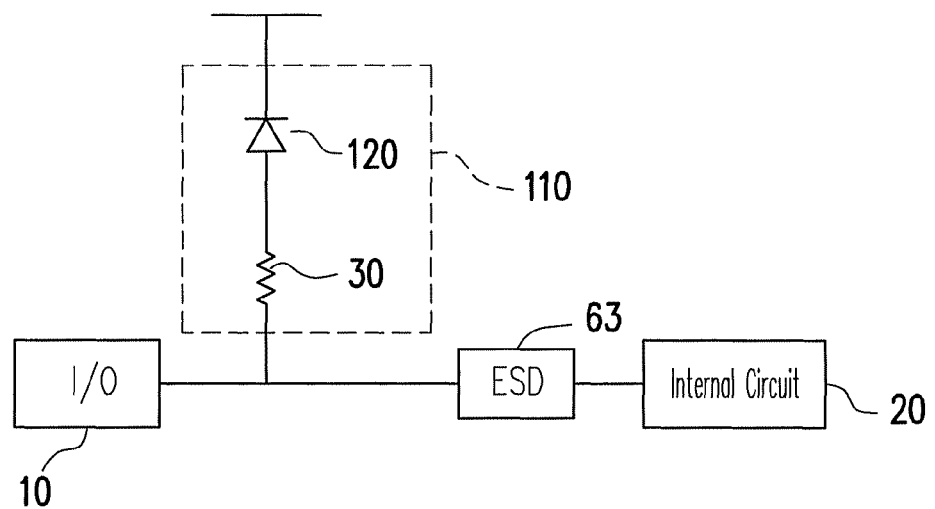

In FIG. 8, another electrostatic discharge protection circuit 63 is coupled between the pad 10 and the internal circuit 20, which is used for preventing the electrostatic discharge current from flowing into the internal circuit 20 via the pad 10. The electrostatic discharge protection circuit 110 in FIG. 8 is implemented in a way different from that of the embodiment of FIG. 7. In this embodiment, a first end of the resistor 30 in the electrostatic discharge protection circuit 110 is coupled between the pad 10 and another electrostatic discharge protection circuit 63, and a second end of the resistor 30 is coupled to the anode of the diode 120. The cathode of the diode 120 is coupled to the supply voltage.

Figure 9:
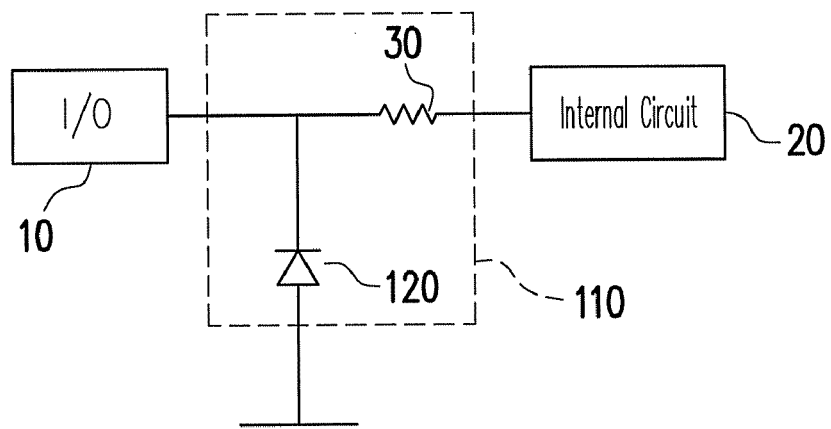
Figure 10:
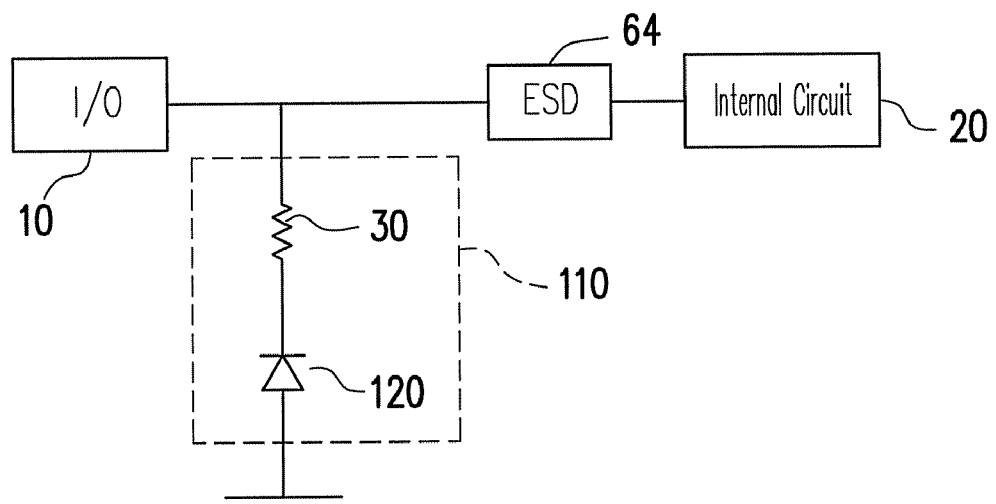

FIG. 9 is similar to FIG. 7, except for the cathode of the diode 120 in FIG. 9 is coupled between the pad 10 and the resistor 30, and the anode of the diode 120 is grounded. FIG. 10 is similar to FIG. 8 except for the cathode of the diode 120 in FIG. 10 is coupled to the resistor 30, and the anode of the diode 120 is grounded.

The electrostatic discharge protection circuits in FIGS. 1-10 provide paths of the electrostatic discharge current when electrostatic discharge occurs, so as to prevent the electrostatic discharge currents from flowing into the internal circuit 20 and causing internal circuit damages.

Figure 11:
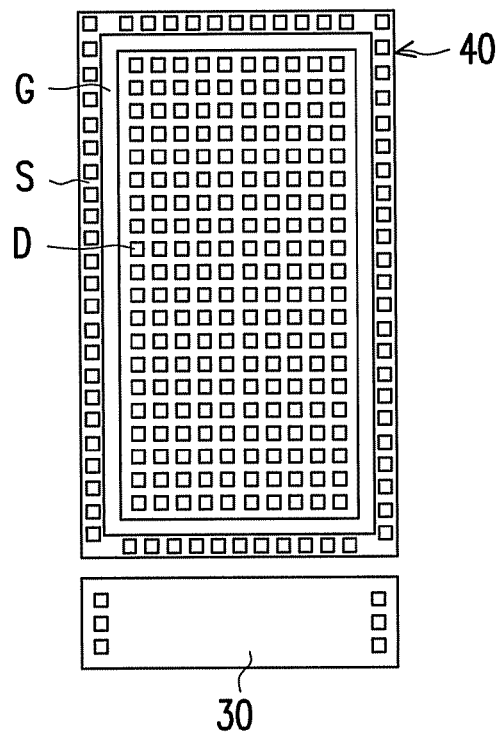
FIG. 11 is a layout diagram of a conventional electrostatic discharge protection circuit.
Figure 22:
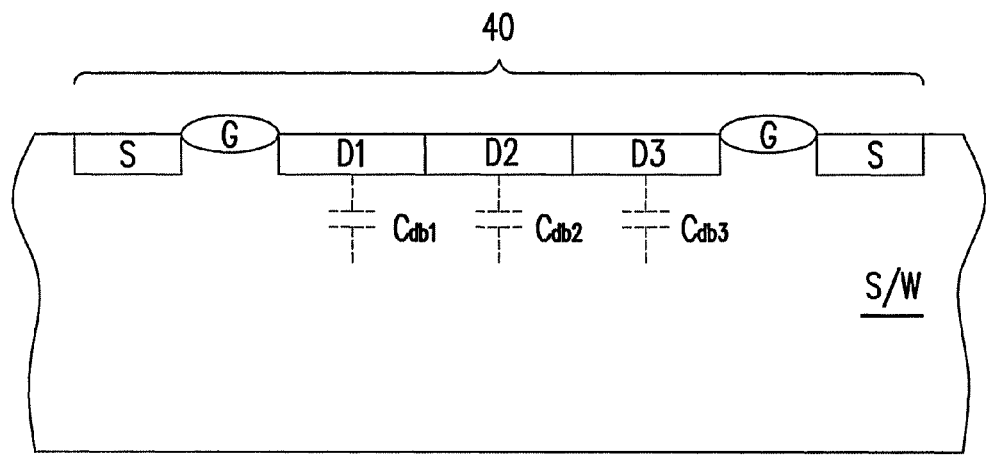
FIG. 22 is a sectional view of a conventional electrostatic discharge protection circuit.

FIG. 11 is a layout diagram of a conventional electrostatic discharge protection circuit. In FIG. 11, the protection element (e.g., the FOD transistor 40 of FIG. 1) and the resistor 30 are disposed on a substrate, and the resistor 30 is disposed outside the region of the protection element 40, which thus occupies an additional area. Besides the disadvantage of occupying a large area, the layout of the conventional electrostatic discharge protection circuit as shown in FIG. 11 also has the problem that the protection element has an excessively large parasitic capacitance. An FOD transistor is supposed to be the protection element of FIG. 11 below in order to illustrate the problem of the parasitic capacitance. Referring to both FIGS. 11 and 22, they are sectional layout diagrams of the protection element (i.e., the FOD transistor) of the conventional electrostatic discharge protection circuit. Referring to FIGS. 11 and 22, G indicates the gate of the FOD transistor, and S indicates the source of the FOD transistor. The drain region D of the FOD transistor (i.e., the region formed by D1, D2, D3 in FIG. 22) is equivalent to an upper plate of the parasitic capacitor, and the substrate (the substrate can be a P-type substrate, a P-type well, or an N-type well) S/W is equivalent to a lower plate of the parasitic capacitor. The capacitance Cdb generated by the overlapped region between the upper plate and the lower plate of the junction parasitic capacitor equals to (Cdb1+Cdb2+Cdb3). To rapidly conduct a large quantity of electrostatic currents, the FOD transistor used as the protection element is generally designed to have a quite large aspect size. Therefore, the conventional art cannot prevent the problem of junction parasitic capacitor with a large capacitance, so the operating performance of the chip is easily influenced, and the crosstalk problem occurs.

Figure 12:
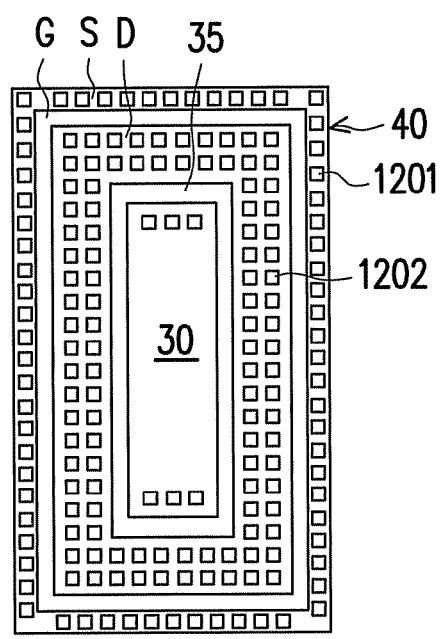
FIGS. 12-14 are layout diagrams of an electrostatic discharge protection circuit with an FOD transistor as the protection element according to an embodiment of the present invention.
Figure 13:
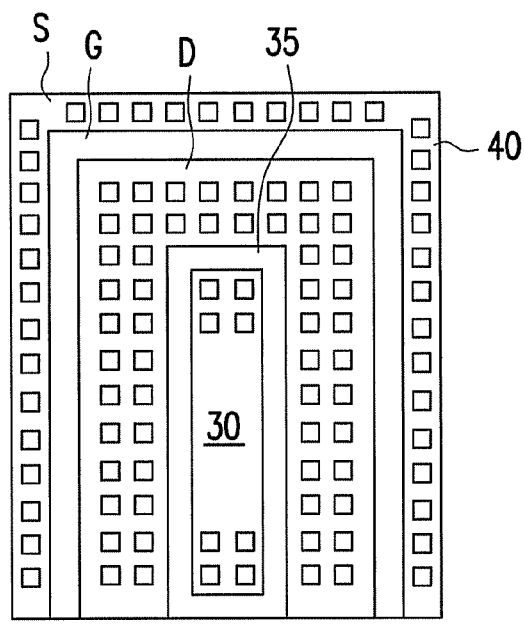
Figure 14:
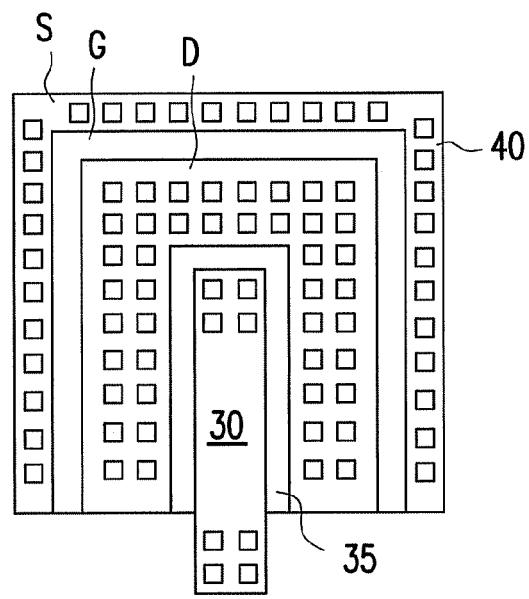

When contacts in the drain end of the protection element of the conventional electrostatic discharge protection circuit reach a certain amount, the contacts have no significant influence on the conductance of the element. Therefore, the present invention reduces the size of the diffusion area in the central region of the protection element and decreases the number of the contacts, and disposes the resistor within the protection element, so as to enhance the space utilization rate. The layout diagram of the electrostatic discharge protection circuit according to an embodiment of the present invention is described below in detail. FIGS. 12-14 are layout diagrams of the electrostatic discharge protection circuit according to an embodiment of the present invention. The electrostatic discharge protection circuit includes a substrate S/W, a protection element and a resistor. In the following embodiments, the protection element is supposed to be implemented by the FOD transistor 40. In FIG. 12, the FOD transistor 40 and the resistor 30 are disposed on the substrate, and all of the area of the resistor 30 is disposed within an isolation region in the FOD transistor 40, and there is a sufficient large isolation distance between the FOD transistor 40 and the resistor 30. In this embodiment, the layout of contact plugs 1202 in the drain D of the FOD transistor 40 and contact plugs 1201 in the source S can be configured into a single line or multiple lines, and the number of the contact plugs is determined depending upon the requirements on the electrostatic discharge protection.

One end of the resistor 30 is coupled to the FOD transistor 40. The connection of the FOD transistor 40 and the resistor 30 with the circuit to be protected is not discussed herein. Persons of ordinary skill in the art can determine the circuit design depending upon the actual requirements and the teaching of the specification.

In this embodiment, preferably, a field oxide layer 35 is further disposed in the isolation region of the electrostatic discharge protection circuit. The field oxide layer 35 is disposed on the substrate in a first direction, and all of the area of the field oxide layer 35 is disposed in the isolation region of the FOD transistor 40. The resistor 30 is disposed on the field oxide layer 35 in the first direction. The cross-section of the preferred electrostatic discharge protection circuit according to the embodiment of the present invention is as shown in FIG. 23.

Figure 23:
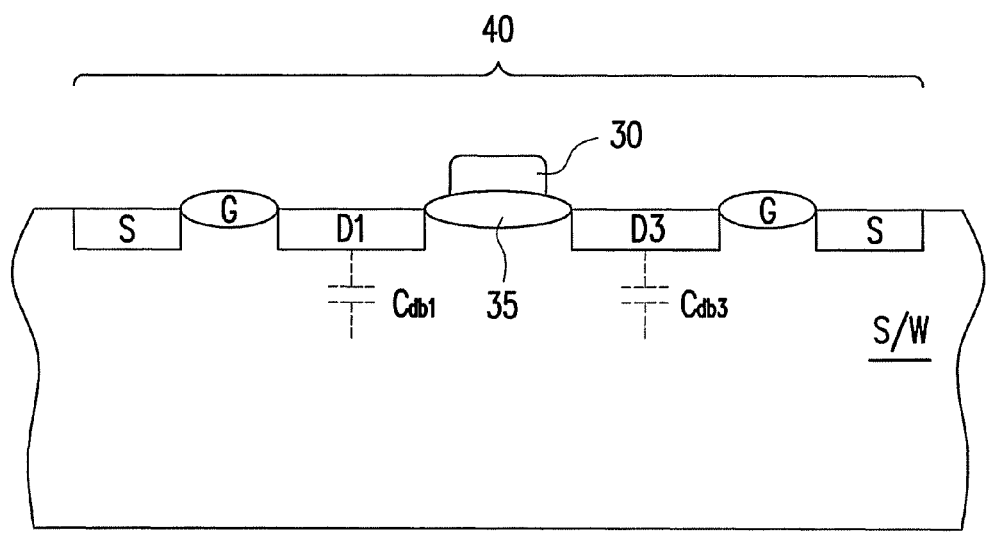
FIG. 23 is a sectional view of an electrostatic discharge protection circuit according to an embodiment of the present invention.

Referring to FIG. 23, a part of the area in the drain region of the FOD transistor 40 is "excavated", i.e., a part of the area in the drain region is not formed with the doped region of the drain. The field oxide layer 35 is formed on the "excavated" region. Then, the resistor 30 is formed on the field oxide layer 35 through deposition or other means. Compared with the conventional art of FIG. 22, as the resistor 30 occupies the central part in the drain region, the parasitic capacitance Cdb generated in FIG. 23 equals to (Cdb1+Cdb3). That is, the resistor is disposed within the protection element, so the area of the drain D is reduced, and thus, the generated junction parasitic capacitance is reduced. Thus, the influence of the electrostatic discharge protection circuit to the entire internal circuit is minimized, and thereby the performance of the internal circuit is enhanced. Moreover, as the field oxide layer 35 is used to isolate the FOD transistor 40 from the resistor 30, the non-electrostatic discharge layout design rules can be applied when selecting a layout design rule, that is, the layout design only needs to meet the requirements of general design rules. Therefore, this embodiment saves the area of the chip.

Certainly, persons of ordinary skill in the art can also implement the present invention with other layout designs, which are construed to be within the scope of the present invention. For example, the present invention also can be implemented with reference to FIGS. 13 and 14. In FIG. 13, the source S, the drain D, and the gate G of the FOD transistor 40 do not use the annular structure of FIG. 12. The isolation region (implemented as the field oxide layer 35) and the resistor 30 can be disposed at the boundary of the electrostatic discharge protection circuit in the first direction, as shown in FIG. 13. Depending upon the requirements of different application conditions, the designer can arrange a part of the area of the resistor 30 within the region of the FOD transistor as well. As shown in FIG. 14, a part of the resistor 30 in the first direction is disposed on the field oxide layer 35.

FIGS. 15-18 are layout diagrams of the electrostatic discharge protection circuit with a metal oxide semiconductor (MOS) transistor as the protection element according to the present invention. Referring to FIGS. 15-18, S indicates a source of the MOS transistor, D indicates a drain of the MOS transistor, and G indicates a gate of the MOS transistor disposed between the source and the drain. All of the area of the resistor 30 is disposed on the isolation region in the MOS transistor, and there is a sufficient large isolation distance between the MOS transistor and the resistor 30. The resistor 30 in FIG. 15 can be implemented in a way similar to that of FIG. 12, which thus is not described herein any more. In this embodiment, the layout of contact plugs 1502 in the drain D and contact plugs 1501 in the source S can be configured into a single line or multiple lines, and the number of the contact plugs is determined depending upon requirements on the electrostatic discharge protection.

Figure 15:
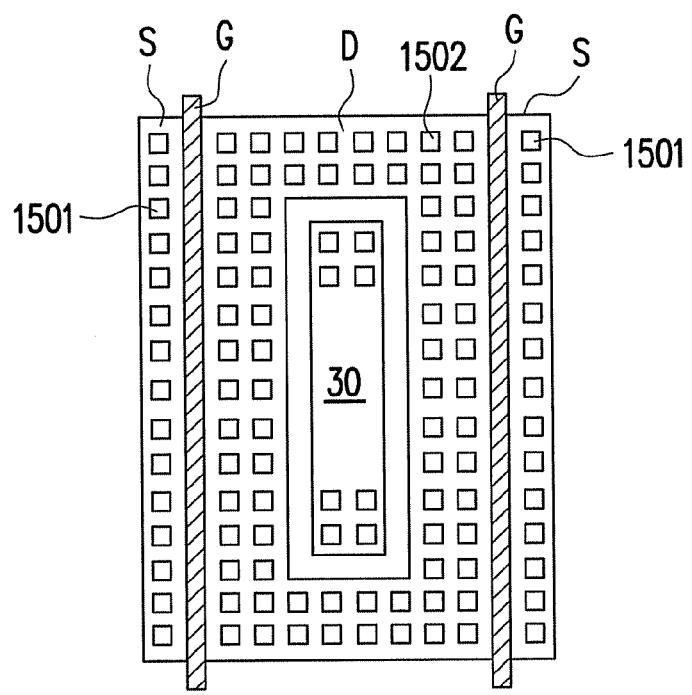
FIGS. 15-18 are layout diagrams of an electrostatic discharge protection circuit with an MOS transistor as the protection element according to an embodiment of the present invention.
Figure 16:
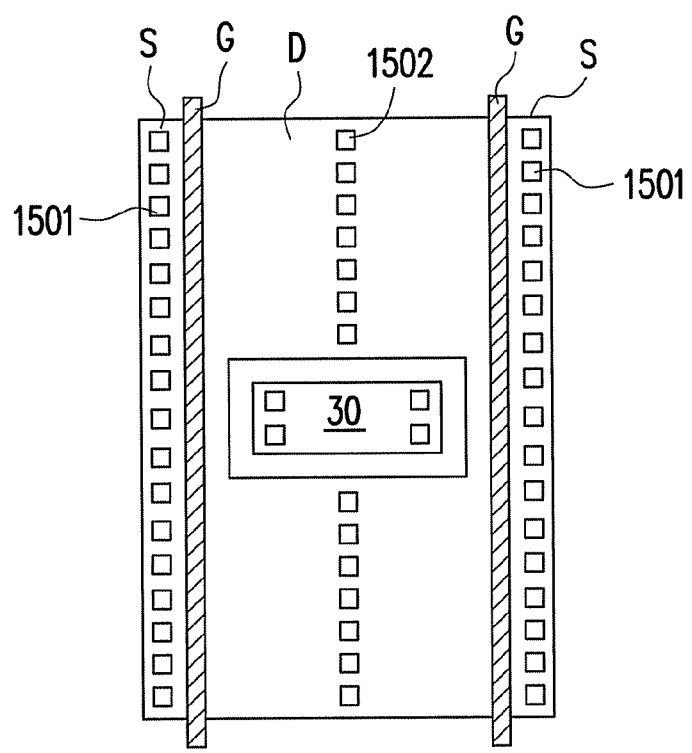

The embodiment of FIG. 16 is similar to that of FIG. 15 except for the MOS transistor is being disposed on the substrate in the first direction, and the field oxide layer 35 is disposed on the center of the MOS transistor in a second direction. The resistor 30 is disposed on the field oxide layer 35 in the second direction, and the second direction is different from the first direction. In this embodiment, the layout of contact plugs 1502 in the drain D can be configured in a single line, and the number of the contact plugs is determined depending upon the requirements on the electrostatic discharge protection.

Figure 17:
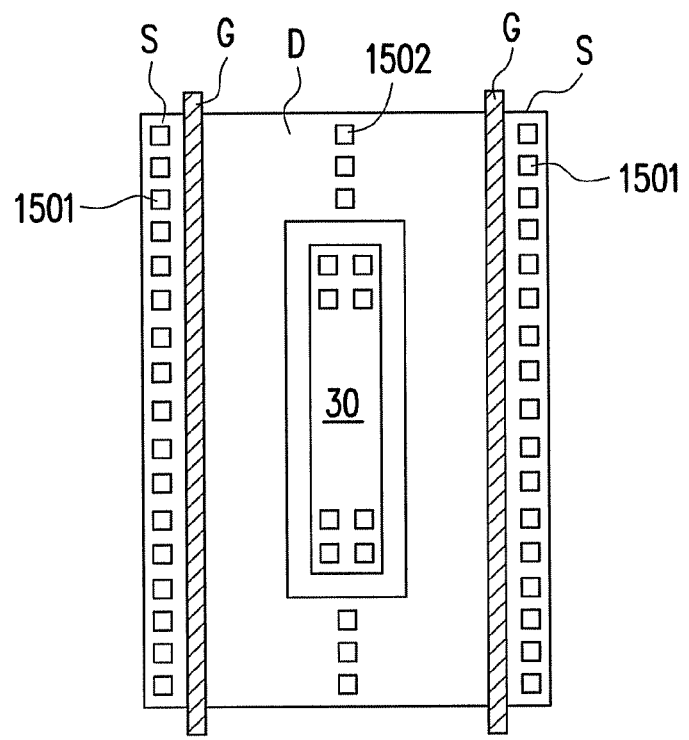

In FIG. 17, the resistor 30 is, in the first direction, disposed on the field oxide layer 35 that is disposed on the substrate in the first direction. This embodiment is similar to that of FIG. 15 except for the contact plugs 1502 in the drain D are changed to be arranged in a single line, thus, the number of the contact plugs is reduced.

Figure 18:
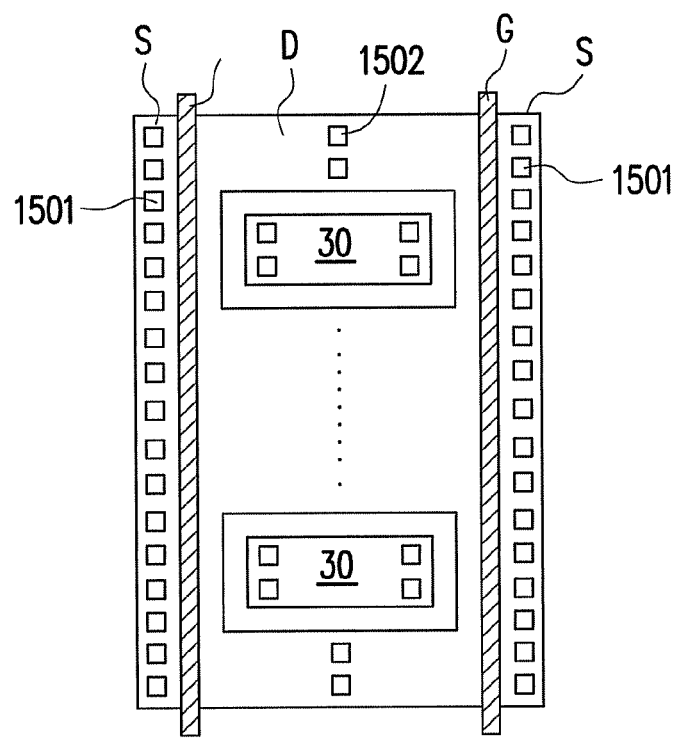

Referring to FIG. 18, this embodiment is similar to that of FIG. 16 except for the resistor 30 includes two or more sub-resistors, and each of the sub-resistors is in the second direction disposed on the field oxide layer 35 that is disposed on the substrate in the first direction, and all sub-resistors are connected in parallel, in series, or using a method combining the above two manners, so as to form the total resistor 30.

Figure 19:
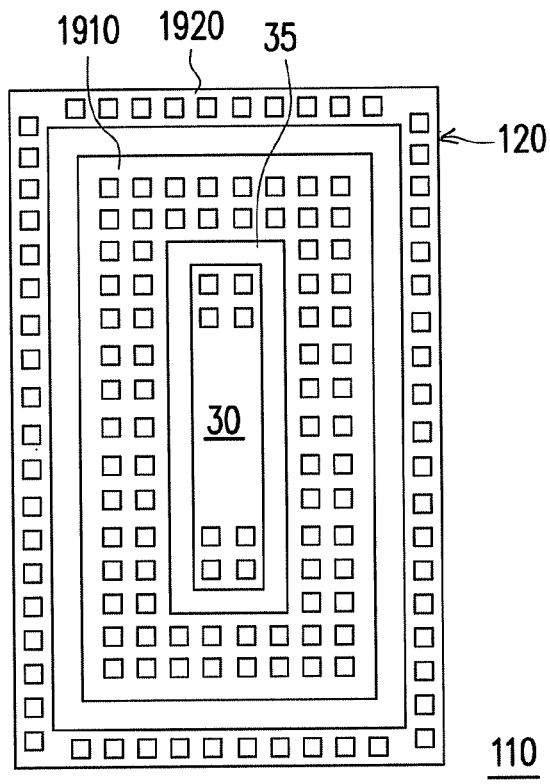
FIGS. 19-21 are layout diagrams of an electrostatic discharge protection circuit with a diode as the protection element according to an embodiment of the present invention.
Figure 20:
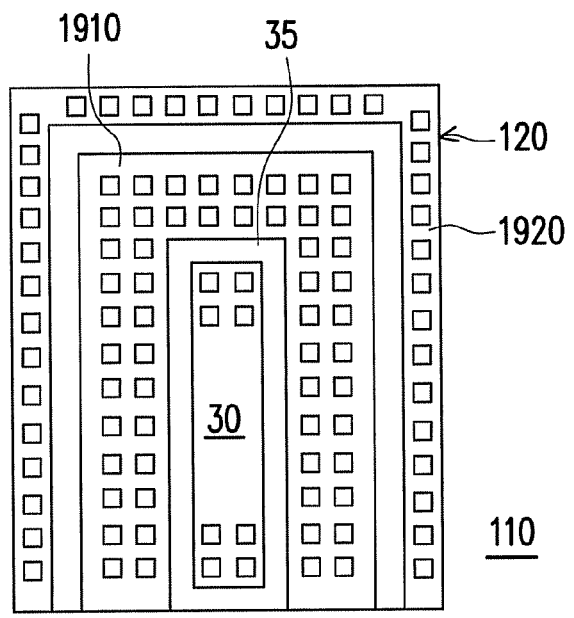
Figure 21:
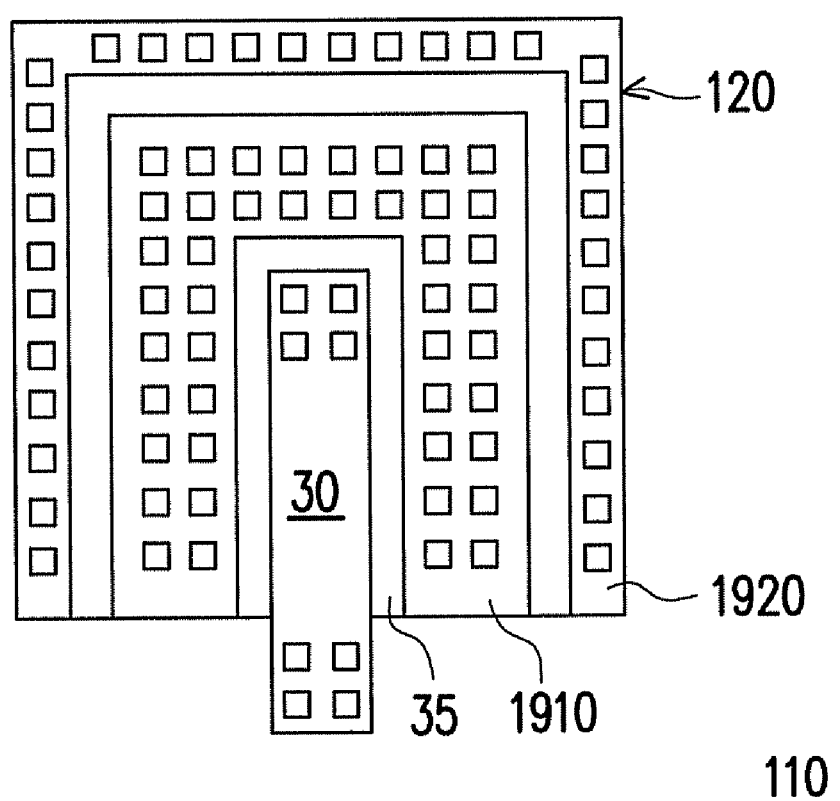

FIGS. 19-21 are layout diagrams of the electrostatic discharge protection circuit 110 with the diode 120 as the protection element according to the present invention. The resistor 30 of FIGS. 19-21 can be implemented in a way similar to that of FIGS. 12-14, which thus will not be described herein. If the doped region 1910 is implemented as a P-type doped region, and the doped region 1920 is implemented as an N-type doped region, the doped region 1910 and the doped region 1920 are served as an anode and a cathode of the diode 120 respectively. On the contrary, if the doped region 1910 is implemented as an N-type doped region, and the doped region 1920 is implemented as a P-type doped region, the doped region 1910 and the doped region 1920 are served as the cathode and the anode of the diode 120 respectively.

It can be understood from the above description that, the present invention also provides a process of fabricating an electrostatic discharge protection circuit, which includes the following steps: providing a substrate; forming a protection element on the substrate, so as to protect the internal circuit from damage caused by the electrostatic discharge current, wherein the region of the protection element includes an isolation region; forming a resistor on the substrate, wherein a part of or all of the area of the resistor is disposed in the isolation region; and coupling an end of the resistor to the protection element. The process further includes forming a field oxide layer on the substrate, wherein a part of or all of the area of the field oxide layer is disposed in the isolation region, and a part of or all of the area of the resistor is disposed in the field oxide layer. The protection element comprises one selected from a group comprising FOD transistor, MOS transistor and diode, and the resistor may comprise a plurality of sub-resistors.

To sum up, in the electrostatic discharge protection circuit according to the present invention, the resistor is disposed within the protection element, so that the area of the resistor is saved, and the generated junction parasitic capacitance is also reduced. Thus, the manufacturing cost for the electrostatic discharge circuit is reduced, and the performance of the internal circuit is enhanced.

It will be apparent to persons of ordinary art in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A layout structure of an electrostatic discharge protection circuit, comprising:
    a substrate;
    a protection element, disposed on the substrate, wherein the protection element is used to receive an electrostatic discharge current to protect an internal circuit from being damaged by the electrostatic discharge current, the protection element comprising:
        a transistor having a gate area, a first drain/source area, and a second drain/source area, the gate area coupled to the first drain/source area and the second drain/source area coupled to the internal circuit for receiving the electrostatic discharge current; and
    a resistor, disposed on the substrate, wherein a part of or all of an area of the resistor is disposed in a region which is encircled by the first and the second drain/source areas of the transistor, and one end of the resistor is coupled to one of the first and the second drain/source areas, wherein the area of the resistor and the first and the second drain/source areas are non-overlapping.

2. The layout structure of an electrostatic discharge protection circuit as claimed in claim 1, further comprising:
    a field oxide layer, disposed on the substrate in a first direction, wherein a part of or all of an area of the field oxide layer is disposed in the region of the protection element, and wherein the resistor is disposed on the field oxide layer in the first direction.

3. The layout structure of an electrostatic discharge protection circuit as claimed in claim 2, wherein a part of the resistor in the first direction is disposed on the field oxide layer.

4. The layout structure of an electrostatic discharge protection circuit as claimed in claim 1, further comprising:
    a field oxide layer, disposed on the substrate in a first direction, wherein a part of or all of an area of the field oxide layer is disposed in the region of the protection element, and wherein the resistor is disposed on the field oxide layer in a second direction, and the second direction is different from the first direction.

5. The layout structure of an electrostatic discharge protection circuit as claimed in claim 1, further comprising:
    a field oxide layer, disposed on the substrate in a first direction, wherein a part of or all of an area of the field oxide layer is disposed in the region of the protection element, and wherein the resistor comprises a plurality of sub-resistors, and each of the sub-resistors is disposed on the field oxide layer in a second direction.

6. The layout structure of an electrostatic discharge protection circuit as claimed in claim 1, wherein the protection element is one selected from a group consisting of a field oxide device transistor and a metal oxide semiconductor transistor.

\* \* \* \* \*